United States Patent [19]
Eilenberg et al.

[11] Patent Number: 5,414,358
[45] Date of Patent: * May 9, 1995

[54] METHOD OF IMPROVING FAT SATURATION DURING MRI

[75] Inventors: Steven S. Eilenberg, Solana Beach; Jack DeFranco; Mark Walters, both of San Diego; W. Dean Kirkland, El Cajon, all of Calif.

[73] Assignee: Alliance Pharmaceutical Corp., San Diego, Calif.

[ * ] Notice: The portion of the term of this patent subsequent to Aug. 16, 2011 has been disclaimed.

[21] Appl. No.: 102,580

[22] Filed: Aug. 5, 1993

Related U.S. Application Data

[63] Continuation-in-part of Ser. No. 928,953, Aug. 11, 1992, Pat. No. 5,339,033.

[51] Int. Cl.⁶ .............................................. G01N 3/00
[52] U.S. Cl. ................................... 324/309; 128/653.4
[58] Field of Search ............... 324/300, 307, 309, 311, 324/314, 322, 318; 128/653.4, 653.5, 654

[56] References Cited
U.S. PATENT DOCUMENTS

| | | | |
|---|---|---|---|
| 4,639,364 | 1/1987 | Hoey | 424/9 |
| 4,684,894 | 8/1987 | Bliehall | 324/318 |
| 4,774,957 | 10/1988 | Nambu et al. | 128/653 |
| 4,791,372 | 12/1988 | Kirk et al. | 324/318 |
| 4,793,356 | 12/1988 | Misic et al. | 324/318 |
| 4,893,627 | 1/1990 | Kehayias et al. | 128/653.4 |
| 4,920,318 | 4/1990 | Misic et al. | 324/318 |
| 4,967,764 | 11/1990 | Basser | 128/654 |
| 4,993,415 | 2/1991 | Long | 128/653.4 |
| 5,154,176 | 10/1992 | Ratner | 128/653.4 |
| 5,183,045 | 2/1993 | Takamura et al. | 128/653.5 |
| 5,339,033 | 8/1994 | Eilenberg et al. | 324/309 |

*Primary Examiner*—Louis Arana
*Attorney, Agent, or Firm*—Knobbe, Martens, Olson & Bear

[57] ABSTRACT

A method for improving fat saturation during magnetic resonance imaging (MRI) by placing a fat saturation enhancing material such as a fluorocarbon, preferably perfluorooctylbromide, perfluorodecylbromide, FC-77, or FC-43, on or around a part of the body of a patient to be scanned with MRI, thereby eliminating the skin-air interface and reducing anatomical imaging problems, wherein the placement of the fat saturation enhancing material may be accomplished by enclosing the fat saturation enhancing material in a container which may also contain the MRI coil.

34 Claims, 7 Drawing Sheets

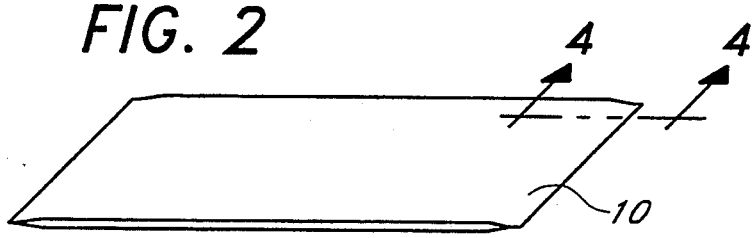
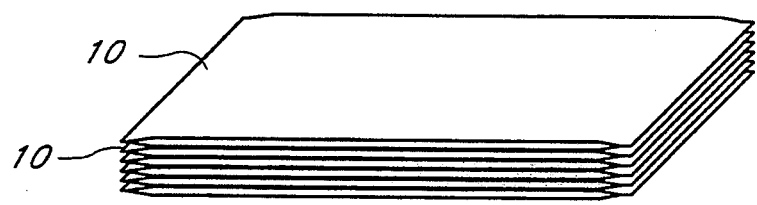
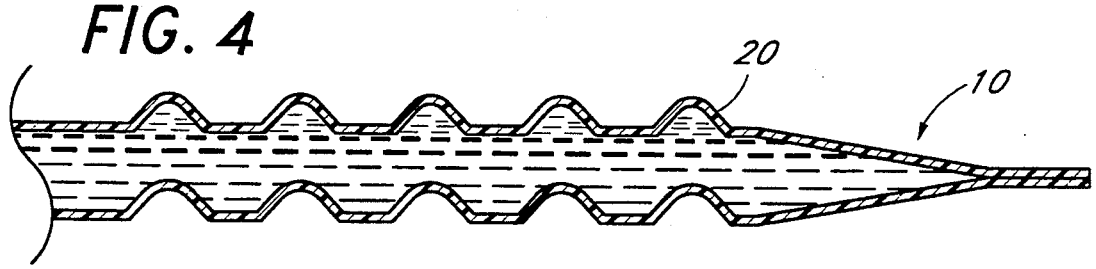
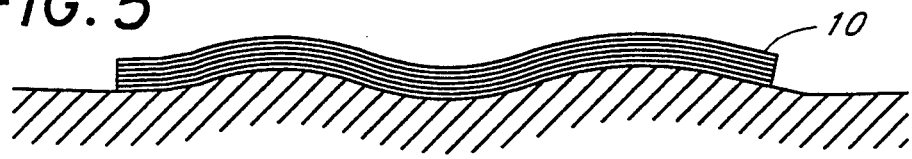
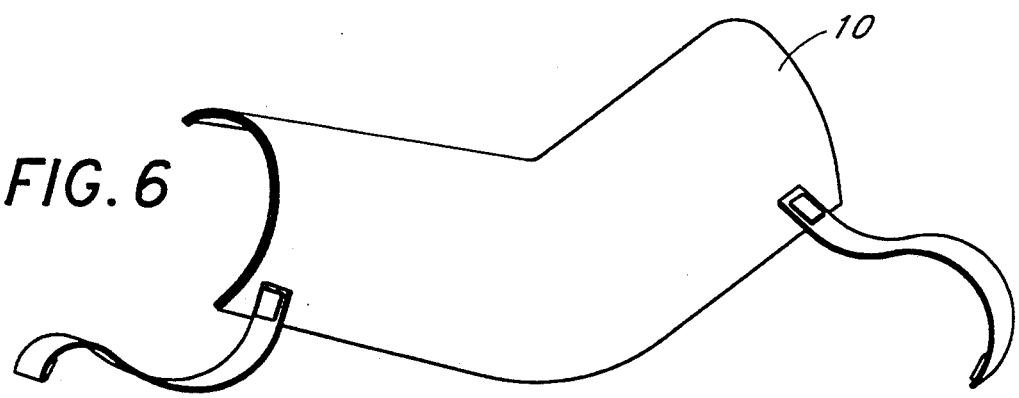

METHOD OF IMPROVING FAT SATURATION DURING MRI

RELATED APPLICATIONS

This application is a continuation-in-part of U.S. patent application Ser. No 07/928,953, filed Aug. 11 1992, now U.S. Pat. No. 5,339,033, which is hereby incorporated by reference.

FIELD OF THE INVENTION

The present invention relates to a method for improving fat saturation during magnetic resonance imaging. More specifically, the invention relates to a method of placing a non-protonated or minimally-protonated material (or a protonated material with a magnetic susceptability similar to body tissue) in proximity to a part of a patient's body being imaged with a magnetic resonance imaging system and then imaging that body part, whereby fat saturation is increased and an improved image of the body part is provided.

BACKGROUND OF THE INVENTION

Magnetic resonance imaging, or MRI, is a method by which the location, size, and conformation of organs and other structures of the body may be determined.

In the typical MRI system, a magnetic field is established across a body to align the spin axes of the nuclei of a particular chemical element, usually hydrogen, with the direction of the magnetic field. The aligned, spinning nuclei execute precessional motions around the aligning direction of the magnetic field. For the aligned, spinning nuclei, the frequency at which they precess around the direction of the magnetic field is a function of the particular nucleus which is involved and the magnetic field strength. The selectivity of this precessional frequency with respect to the strength of the applied magnetic field is very short and this precessional frequency is considered a resonant frequency.

In an ordinary MRI system, after the nuclei have been aligned or polarized, a burst of radio frequency energy at the resonant frequency is radiated at the target body to produce a coherent deflection of the spin alignment of the selected nuclei. When the deflecting radio energy is terminated, the deflected or disturbed spin axes are reoriented or realigned, and in this process radiate a characteristic radio frequency signal which can be detected by an external coil and then discriminated in the MRI system to establish image contrast between different types of tissues in the body. MRI systems have a variety of different excitation and discrimination modes available, such as free induction decay ("FID"), spin echo, and continuous wave, as are known in the art.

Two parameters are used to measure the response of the magnetized sample to a disturbance of its magnetic environment. One is T1 or longitudinal relaxation time, the time it takes the sample to become magnetized or polarized after being placed in a external magnetic field; the other is T2, the spin relaxation time, a measure of the time the sample holds a temporary transverse magnetization which is perpendicular to the external magnetic filed. Images based on proton density can be modified by these two additional parameters to enhance differences between tissues.

Hydrogen is usually selected as the basis for MRI scanning because of its prominent magnetic qualities. Hydrogen, having a single proton nucleus, is easily polarized. Further, hydrogen is abundant in water, a major component of the human body. Tissues which have a high content of water, and thus hydrogen and hydrogen protons, are deemed "protonated" and provide strong images during MRI. One disadvantage to hydrogen scanning, however, is that water is a major component of most of the bodily tissues and organs. Therefore, most all of the tissues of the body are imaged, making it difficult to distinguish the various tissues with similar hydrogen content during MRI scanning.

The images formed in magnetic resonance imaging are really a converted visual display of the otherwise invisible radio waves emitted by protons (when scanning for hydrogen atoms) which are detected by the MRI pick-up coil. When scanning for hydrogen atoms, tissue areas which have no hydrogen atoms emit no radio waves, and thus the MR image of this tissue is black. Tissues which have a high hydrogen content, on the other hand, may emit a large amount of radio waves depending on the scanning criteria. Such signals are converted into a correspondingly bright visual display image. Normally, grey scale assignment, based upon the relative energy or signal intensities received from the tissues, is utilized in order that the user may more easily distinguish the various tissues and organs imaged. On these grey scale images, low or no signal is designated as black, and very high signals are assigned a lighter shade of grey or even white.

Occasionally, tissues which are in abundance and create a bright signal may overwhelm the signal emanating from less abundant and differently hydrogenated species or tissue. This may visually mask the latter tissue and obscure a disease process or anatomy. As an example, bone marrow in the adult is very fatty and is very bright on the MR image. Subtle bone marrow pathology such as edema or inflammation may be completely obscured by the signal from the fat. This decreases the sensitivity of MRI for certain disease processes and creates a problem for the diagnostician.

Various methods have been used in order to try and separate the signals coming from the various tissues of the body and thereby produce more distinct images. One such method involves nullifying the signal received from a certain tissue. This is done by utilizing spin echo and gradient echo presaturation pulse sequences based upon information about subtle differences in the precessional frequency of hydrogen atoms as they associate with fatty versus non-fatty tissues. For example, in order to improve the conspicuity of non-fatty tissues which lie in a background of a fatty tissue, the entire tissue is first subjected to a chemically specific saturation radio pulse. This preparatory pulse essentially effects the hydrogen atoms associated with the fat molecules. These pretreated hydrogen atoms have, in a sense, been briefly deactivated and are not able to emit a useful signal when the actual imaging portion of the pulse sequence commences. The MR image is then created with little or no contribution from the fatty tissue. The resultant image will show the non-fatty tissue against a dark background. This process is called chemically selective presaturation of fat, or fat saturation.

This fat saturation process is unreliable. Because the precessional differences between the fatty and non-fatty tissues are very minute, the technique must be very precise or non-fatty tissues are inadvertently variably saturated themselves. This problem is further compounded by the fact that the local magnetic environment of tissues changes based upon their position relative to the coil; position in the magnetic bore; and position with respect to organs or tissues with different magnetic susceptibilities (e.g. tissue next to bone or tissue next to air). Not only is the immediate magnetic environment important, but the actual geometry of the organ or body part plays a major role in determining the fatty tissue's likelihood of being nullified with the fat saturation technique. For example, fat is more likely to be saturated in the rather cylindrical thigh than in the right angle of the ankle.

Further, interpretive problems can arise in several ways. First, if the fat is not saturated effectively, then pathology can be obscured. Second, if the fat is saturated in only portions of the body part being imaged, then the areas not saturated may be misinterpreted as pathologic tissue. Third, drastic alteration in geometry and magnetic susceptibility which naturally occur in the neck, shoulders and ankle, for example, can lead to inappropriate saturation of non-fatty tissues which are the subject of the examination.

One method occasionally used to improve fat saturation by addressing the above stated limitation of this technique involves placing water bags around the body part being scanned. This technique is useful in that there is improvement in the quality and reliability of the fat saturation technique. This is based on reducing or eliminating the tissue-air interface and by effectively changing the perceived geometry of the body part (e.g. changing the right angle configuration of the ankle to a more favorable cylindrical shape.)

Water, however, is highly protonated and creates a correspondingly bright signal surrounding the fat site. The bright background is a serious disadvantage for this procedure because it is distracting and counteracts the improved visualization produced by using water-filled bags with fat saturation sequences.

SUMMARY OF THE INVENTION

Notwithstanding the foregoing developments in the art, there remains a need for an improved means of achieving fat saturation during MRI. It has been found that fluorocarbon compounds which have a magnetic susceptibility similar to that of water containing human tissue, improve fat saturation when such compounds are placed next to a tissue to be scanned during MRI. In particular, fluorocarbon materials containing little or no hydrogen, when placed around a body part being scanned, effectively eliminate the skin-air interface, eliminate the magnetic susceptibility differences, dramatically improve the fat saturation efficacy, and add no signal of their own to the final image. The fat is homogeneously saturated, the non-fatty tissues are not inappropriately saturated, and there is no distracting signal from this entirely external device.

The fluorocarbon compounds perfluorooctylbromide (PFOB), perflourodecylbromide (PFDB), FC-77, and FC-43 have been found to be especially effective in improving fat saturation. These compounds have a magnetic susceptibility similar to that of tissue. Further, these compounds are a liquid at room temperature. This allows the fat saturation enhancing material to be packaged into flexible bags for use about the tissue of the patient. Further, all of the above fluorocarbons have the advantage of being stable and non-toxic.

Other compounds, including protonated compounds, which do not have protons that resonate at the same frequency as the tissue to be imaged would also be suitable for improving fat saturation. Such compounds are useful in all physical states including liquid, solid, particulate, or gel.

Therefore, a preferred embodiment of the present invention comprises a device for improving fat saturation during magnetic resonance imaging comprising a fat saturation enhancing material packaged in a container. Preferably, the fat saturation enhancing material is a liquid fluorocarbon, such as PFOB, PFDB, FC-77 or FC-43, and is packaged into bags. In one form, these bags are thin and flexible. This construction reduces the weight of the material placed on the patient, and allows the bags to contour themselves to the skin surface of the patient so as to eliminate the skin-air interface. These bags are preferably stackable so that they can be used in areas of varying anatomical structure and so that the optimum cylindrical scanning configuration may be obtained.

In another form, the bags are somewhat larger and thicker. In this form the bags are useful in areas of widely varying anatomical structure and do not have to be stacked. In order to reduce the weight of the filled bags and to reduced the cost of the material put therein, such bags contain a filler material. The filler is a material which is effective in supporting the bag surfaces, is itself flexible, and is porous or pervious such that the fluorocarbon material can circulate through the bag. Such filler materials include celite (diatomaceous earth); silica; polyurethane foam; polyester; and absorbent towel material.

In yet another embodiment, a bag is incorporated into an outer rigid or semi-rigid shell structure. In this form, a bag having a hollow portion for introduction of a body part is attached to the inside of the outer shell. Fat saturation enhancing material is placed inside the bag in order that the fat saturation enhancing material may be placed in close proximity to a body part positioned within the hollow portion of the bag and shell.

In order to maximize MR imaging conditions, the outer shell is shaped such that its outer surface is cylindrical. Further, the hollow portion of the bag into which the body part is inserted is shaped such that the fat saturation material is in close proximity to the portion of the body which is to be imaged. For example, the hollow portion of the bag may be shaped as a glove for the introduction and MR imaging of a hand, or may be cylindrical to allow the introduction and imaging of a leg or arm. Lastly, the bag is selectively fillable. In this manner, the bag may be drained of fat saturation enhancing material to allow a portion of a patient's body to be positioned within the hollow portion of the bag. Then, the bag may be filled with fat saturation enhancing material to a point at which the bag is in complete contact with the portion of the body to be imaged. This ensures that the fat saturation material completely surrounds the area being scanned.

In another embodiment, the bag containing the fat saturation enhancing material surrounds a flexible coil for MR imaging. Flexible coils are well known in the MR imaging field and increase the quality of images by transmitting and/or receiving more homogenous signals in the tissue because they wrap around the body part to be imaged. Furthermore, flexible coils efficiently image many body parts of different sizes and geometries, unlike the limited uses of rigid, dedicated coils.

Wrap-around imaging is especially useful for geometically changing anatomic body areas such as the head, wrist, neck, shoulder, breast, knee, and ankle. A disposable flexible sheath surrounding the coil may be used to protect the coil from contamination. By enclosing a flexible coil within a flexible bag containing fat saturation material, the combination would further enhance image quality by eliminating air between the coil and the patient.

In another embodiment, which can be understood with reference to FIG. 8, a flexible MR coil forms at least a portion of the outer surface of the bag containing a fat saturation material. The coil attached to the bag would be flexible, providing direct, wrap-around contact with the patient during imaging. Thus resolution would be improved, especially for geometically changing anotomic body areas as discussed above.

In another embodiment, a MR imaging coil within a bag containing fat saturation material is inserted into a body cavity for imaging the surrounding tissue. Such endo-cavity coils would be rigid, semi-rigid, or flexible MR coils contained within a flexible bag holding fat saturation material. Endo-cavity coils would be used, for example, to image the rectum, vagina or oral cavity. The endo-cavity coil would increase the quality of the cavity image for the reasons presented above.

In another embodiment, the present invention comprises a method for improving fat saturation during magnetic resonance imaging. Fat saturation can be improved by providing a fat saturation enhancing material, such as PFOB, PFDB, FC-77, or FC-43, in a container, placing the container on or around a part of a patient's body to be imaged, and then imaging that body part with an MRI system. Preferably, the fat saturation enhancing material is a fluorocarbon, such as PFOB, PFDB, FC-77, or FC-43. Alternatively, other compounds that have protons that do not resonate at the same frequency as the tissue to be imaged may be used. More preferably still, the container is placed so that the container and the body part to be imaged together have a substantially cylindrical geometry.

These and other aspects of the invention will become apparent from a study of the following description in which reference is directed to the following drawings.

DESCRIPTION OF THE DRAWINGS

FIG. 2 is a perspective view of a bag of the present invention.

FIG. 3 is a perspective view of a number of the bags of FIG. 2, illustrated in stacked form.

FIG. 4 is a partial cross sectional view of the bag in FIG. 2, while the bag contains fat saturation enhancing material.

FIG. 5 is a side view of a number of the stacked bags on a patient's body illustrating how the bags follow the contour of the body.

FIG. 6 is an enlarged perspective view of the custom shaped bag of FIG. 1.

DETAILED DESCRIPTION OF THE INVENTION

Fluorocarbon compounds, alone or in combination with similar compounds, are effective in improving fat saturation during MRI and other medical imaging diagnostic procedures.

Because fatty tissue is highly protonated, this tissue emits a strong signal when scanned, thus appearing relatively bright on the MR image. The bright signal may mask less abundant, non-fatty hydrogenated tissues that are admixed with the fat. This non-fatty tissue is frequently the area of greatest interest on the MR examination, and can be obscured by the overwhelming signal from the abundant fat.

Magnetic resonance imaging is enhanced when the fatty tissue is "saturated." When this occurs, the fatty tissue emits no signal and appears dark or even black on the final image. This provides good contrast to the other tissues which are admixed with the fat. This is advantageous, as the admixed, non-fatty tissues are frequently the targeted tissues of greatest interest on the MR examination.

Figure 1:
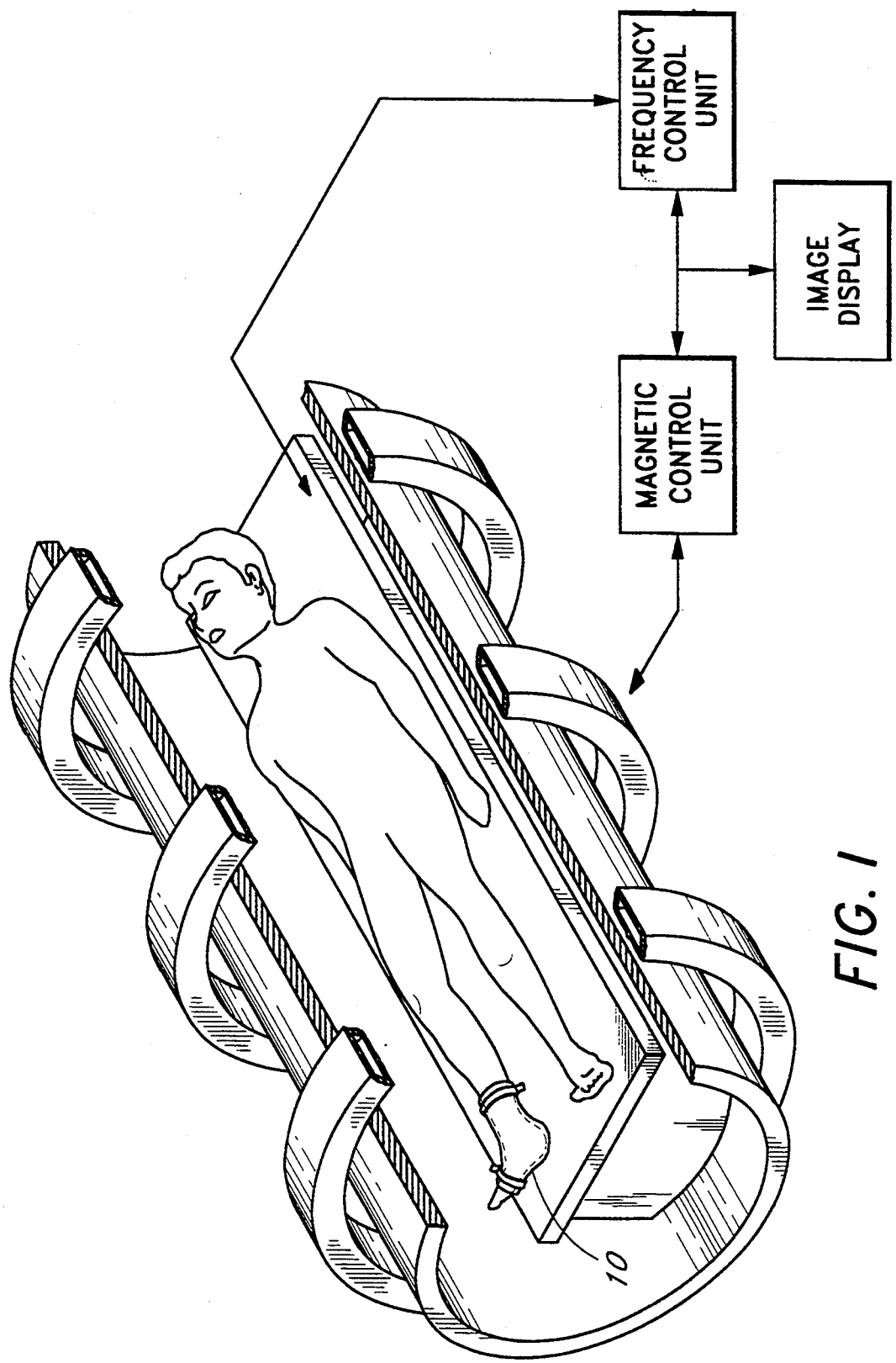
FIG. 1 is a perspective view of a patient in a magnetic resonance scanning machine, illustrating a bag filled with fat saturation enhancing material placed about the ankle of the patient.

As illustrated in FIG. 1, and as described in greater detail later, when fluorocarbon compounds low in, or lacking, hydrogen, are placed adjacent the tissue being scanned, these compounds are effective in improving fat saturation. Such fluorocarbon compounds are low in hydrogen, and thus little or no radio wave energy is emitted from these compounds during MRI. The corresponding MR image of this material is dark or black, providing an effective contrast image. Further, fluorocarbon compounds have a magnetic susceptibility similar to that of tissue. When placed near the skin-air interface, these compounds aid the MRI machine in achieving fat saturation. The fluorocarbon compounds are preferably those which are liquid at room temperature and are nontoxic. A large number of relatively safe fluorocarbon liquids are known, and can be used in the present invention. For examples of suitable fluorocarbon liquids, see, for example, U.S. Pat. No. 5,077,036.

While fluorocarbon compounds are effective in improving fat saturation, other materials may also be effective. Any such material must have a low hydrogen content, or in other words be non-protonated or minimally protonated, and have a number of other qualities.

Any other protonated material wherein the protons do not resonate at the same frequency as body tissues would be suitable. The material must be stable, and must have a magnetic susceptibility which is similar to that of human tissue. Preferably, the material is also non-toxic and is easily conformable for use at various locations on a patient's body. Such a material is also preferably a liquid at room temperature, but may be a nonprotonated or low protonated, flexible solid such as Gortex ™ brand polytetrafluoroethylene (W. L. Gore & Co.). Microfibers or microparticles of non or low protonated solids would be suitable materials also because they can flow in a manner similar to liquids.

Fluorocarbon compounds having a low hydrogen content satisfy these requirements. These compounds also have a magnetic susceptibility similar to that of water containing human tissue, and can be placed in a bag or packet which conforms to a patient's body shape. These compounds, when in their liquid form, can as well be easily placed into a bag or packet which readily conforms to the shape of the body of a patient.

It has been determined that perfluorooctylbromide (PFOB), perfluorodecylbromide (PFDB), FC-77 and FC-43 are especially effective in improving fat saturation during MRI. Further, mixtures of these compounds or fluorochemicals having the same magnetic susceptibility as water are believed suitable. These fluorocarbons have the advantage of containing no hydrogen, and have a magnetic susceptibility that is similar to that of tissue. This property allows the MRI units to effectively recognize these agents as a portion of the body. This feature aids in improved imaging because when these fluorocarbons are placed in contact with or very near the surface of a patient's body, the problems associated with MRI scanning at the skin-air interface are reduced or eliminated. Because the skin-air interface is effectively eliminated, the MRI machine more effectively achieves fat saturation. In addition to improving magnetic resonance images created with fat saturation techniques, the present invention can also improve image quality when using pulsing parameters sensitive to magnetic field homogeneity. These include chemical shift water saturation, gradient echo imaging, magnetic resonance spectroscopy and perfusion/diffusion imaging.

These materials also have the advantage of being easily packagable because they are in a liquid or gel state at room temperature. This allows the compounds to be placed in containers which conform to or may be placed around any portion of a patient's body. In this fashion, the skin-air interface is more effectively eliminated. However, although liquid fat saturation enhancing materials are the preferred, solid or gaseous materials are also contemplated. For example, solid fluorocarbon polymer compounds, such as Gortex ™ or Teflon ™ (both brand names for polytetrafluoroethylene), are believed suitable. Teflon ™ in sheet form can be pressed against the body. Such solids in sheet form have the advantage of covering a large area of the body without the corresponding weight of liquids in bags. For example, a relatively flat, solid Teflon ™ device placed over the chest or back of an individual could be used to improve the fat saturation of an MRI system. A gaseous fat saturation enhancing material, such as a gaseous fluorocarbon material, is also contemplated. In this form bags 10 may be filled under pressure with gaseous fluorocarbon material. Saturation enhancing material in gel form could also be used to fill bags 10.

There are other fluorocarbon compounds which are believed to be effective in improving fat saturation. For example, it is also believed that perfluorocarbon hydrides, such as perfluorooctylhydride (PFOH), are satisfactory materials for use in improving fat saturation. Further, perfluorohexylbromide (PFHB) is also believed to be an effective agent in improving fat saturation. Also, fluorosilicone and silicofluorocarbon compounds are believed to be effective in improving fat saturation. As stated above, mixtures of fluorocarbon compounds which have the above-stated characteristics are also believed suitable.

As is illustrated in FIGS. 1 & 2, in the preferred embodiment the material which improves fat saturation is preferably in a liquid form, such as PFOB, PFDB, FC-77 or FC-43, and is placed inside a bag 10 or other container for placement about the body part of the patient during MRI.

As stated above, it is desirable to eliminate the skin-air interface during MRI. While it is possible to accomplish MRI while immersing the patient in the imaging enhancing material, such as PFOB, this is impractical. This method is effective in eliminating the skin-air interface and surrounds the imaged tissue with a material having a similar magnetic susceptibility. These qualities do aid the machine in achieving fat saturation and thus improved imaging. Unfortunately, however, this method is messy, costly and often very uncomfortable. Further, it often is difficult to submerge certain body parts without submerging the entire body.

As illustrated in FIG. 2, it is therefore desirable to utilize a liquid fluorocarbon compound placed in bags 10 or similar suitable containers. The bags 10 are preferably made of a thin material which is durable, not permeable to the fluorocarbon material, is low in cost, and is sufficiently flexible that it will conform to the body of a patient. Ethylvinylacetate, polyurethane, nylon, and laminates such as polyethylene/polyester have been found to be good bag 10 materials.

As illustrated in FIG. 2, it is preferable that the bags 10 be thin. Such bags can be formed, for example, by impulse, RF, or hot bar sealing the fluorocarbon material between sheets of the ethylvinylacetate, polyurethane, nylon, or laminates such as polyethylene/polyester. Thin bags 10 have the advantage that the fluorocarbon material may be placed therein and sealed such that little or no gas is trapped inside the bag, since large amounts of gas interfere with the ability of the machine to achieve fat saturation. Further, thin bags 10 contain less fluorocarbon, which material can be quickly cooled or heated so as to effect peripheral circulation of the patient when the bags are in contact with the skin of the patient. Lastly, the thin bags 10 contain less fluorocarbon material, so that if punctured, material loss is limited.

In order to allow the bags 10 to be used in conjunction with one another, the bags are preferably stackable or linkable, as illustrated in FIG. 3. In order to improve stackability, interlocking ridges 20 may be formed onto the outside surface of the bags 20, as illustrated in FIG. 4. Alternatively, the bags 10 may have adhesive strips or hook-and-pile fasteners (such as Velcro ®-brand fasteners) on their surfaces so as to provide an effective means of securing the bags together, or they may be encased in a coverlet, although any means known to those skilled in the art is sufficient.

Where the bags 10 are used in areas of fairly uniform body surface, such as the stomach or thigh, the flexibility of the bags 10 allows them to easily conform to the body surface, as is illustrated in FIG. 5. In this fashion the tissue-air interface is effectively eliminated.

For areas of the body where the anatomical structure is more varied, the bags 10 are shaped to conform to the particular area. For example, it is difficult to place a flat, rectangular or square bag about the ankle. As illustrated in FIGS. 1 & 6, when the bag 10 is formed with a bend or angle, the bag and material therein more effectively seal against the tissue along the leg and foot so as to eliminate the tissue-air interface. Further, any bag 10 may be fitted with straps, ribs, bottom seals, or other attachment means in order to secure the bags to the patient. Such attachment means may include Velcro ® or adhesive, or other means known in the art which do not interfere with the image during the MR examination.

The bags 10 are also designed such that when placed around the area being examined, the cross section of the image enhancing material, in conjunction with the body, can be made substantially cylindrical. As stated above, MRI machines have difficulty imaging and achieving fat saturation or nullification in areas where the body has a changing anatomical cross section. Preferably, for the best imaging and most efficient fat saturation, the area being scanned is nearly cylindrical in geometry. Unfortunately, several areas of the body do not have this desired geometry. For example, at the ankle, the joint is configured at nearly a right angle.

In order to enhance imaging and improve fat saturation, it is desirable that the fat saturation enhancing material, when placed on the body, aid in creating a mass which has this cylindrical geometry. This may be accomplished by forming bags 10 which contain the preferred fluorocarbon material in the desired form. For example, bags can be custom designed to conform with specific areas of the body, or one "convoluted" bag might be used at various anatomical positions. Unfortunately, this is often very difficult. In the ankle area, this requires that the fluorocarbon material fill the area between the anterior aspect of the lower leg to the toes. While this may be accomplished by filling a large bag with the material, this too, is impractical. Alternately, the bags 10 may be stacked as described previously. In certain areas of the body, however, the number of bags 10 which must be used to accomplish this makes it difficult to arrange the bags. Further, fluorocarbon fluid is very dense, which causes the placement of a number of the bags 10 to be uncomfortable for the patient. Also, the cost of filling larger bags 10 with the material is often prohibitive.

Figure 7:
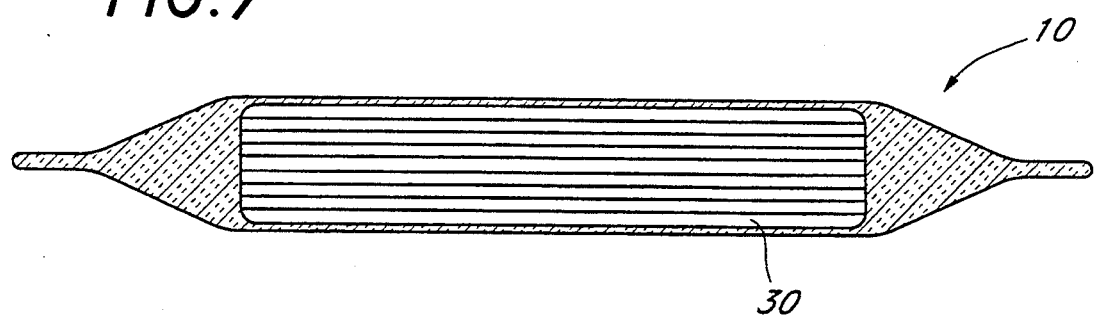
FIG. 7 is a cross sectional view of a bag containing the fat saturation enhancing material and a filler material.

In the preferred embodiment, as illustrated in FIG. 7, larger bags 10 are filled with a filler 30 material which supports the bag 10 in various shapes. Introduction of the filler 30 also reduces the total volume of the bag 10 which must be filled by the fat saturation enhancing material. It is desired that the filler 30 be a material which is light-weight, inexpensive and non-toxic. The filler 30 must be able, when inserted into the bag 10, to support the bag surfaces. Further, the filler material 30 must have no magnetic susceptibility, and must be porous or at least not impervious, so that the material, such as PFOB, may fill the bag 10, and yet still flow throughout the bag 10. The filler may, for example, be any space filling material such as a sponge-like polymer foam material; a loose, particulate material; a synthetic fibrous material (e.g., batting or woven or nonwoven fabric); or a natural fibrous material.

Several filler 30 materials have been found which have these desired characteristics. These materials include: celite (diatomaceous earth); silica; polyurethane foam; rubber foams; polyester; and absorbent towel material.

Advantageously, the bags 10 have an inner filler material 30 to reduce the weight of the bag 10 when filled with the fat saturation enhancing material. The material is effectively dispersed throughout the bag 10 so that the material serves its fat saturation enhancing functions.

Bags 10 containing fat saturation enhancing material such as liquid PFOB serve several other functions. First, the filled bags 10 may be used to increase patient comfort. The table upon which a patient is forced to lie while undergoing MRI is flat and stiff. Bags 10 of the material may be used to provide some cushioning for the patient. Further, the bags 10 may be used to prop or position the patient in particular positions to enhance MRI. Thus, positions which are uncomfortable for a patient to maintain on their own may be maintained easily through the manipulation of the filled bags 10.

An alternate preferred embodiment of the bags 10 is illustrated in FIGS. 8-12. In this embodiment, the bags 10 are selectively fillable and are mounted within an outer shell 40.

Figure 8:
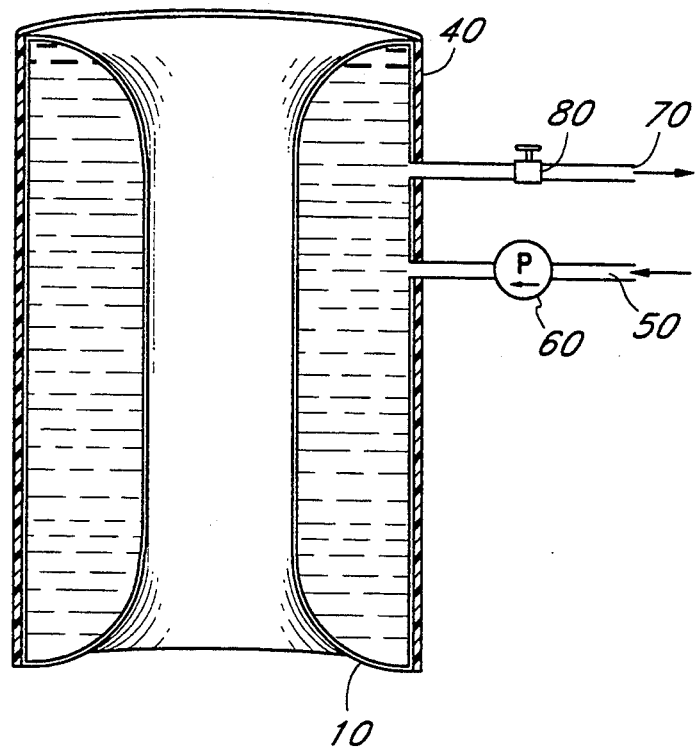
FIG. 8 is a cross sectional view of a bag containing fat saturation enhancing material mounted within an outer shell.

As illustrated in FIG. 8, the bag 10 has a hollow portion to allow the introduction of a portion of a patient's body, and is connected to an outer shell 40. The shell 40 is preferably a rigid or semi-rigid structure made of plastic or a similar material which has no magnetic susceptibility. The shell 40 may be shaped in any of a variety of configurations, however, it is preferred that the shell be hollow, have at least one open end or side for insertion of the body part to be imaged, and have an outer surface which is cylindrical in shape, in order to facilitate best imaging conditions. A cylindrical shape is particularly perferred for use in MRI systems having a cylindrical coil, and may be shaped to fit closely into the coil or, in one embodiment, may be actually built into the MRI machine.

The shell 40 acts as a support structure to which one of the bags 10, as described above, may be integrally mounted. As illustrated in FIG. 8, the bag 10 is already sealed closed and is attached to the inside walls of the shell 40. Alternatively, the bag 10 could utilize as its outer walls the inner walls of the shell 40, the bag extending inwardly from its connection to the walls of the shell 40. In this form, the bag 10 may be formed by heat sealing or gluing the edges of the bag material to the shell 40.

As stated above, the bag 10 has a hollow center portion corresponding to the open end of the shell 40, into which a body part may be positioned. For example, the bag 10 illustrated in FIG. 9 has a hollow portion 90 shaped like a glove. The ability to form the hollow portion of the bag 10 into various forms allows the bag, and the fat saturation enhancing material located therein, to be positioned close to the tissue which is to be imaged. This feature is especially advantageous when the body part being imaged has a complex geometry and the placement of single bags like those described above is difficult. For example, the shell 40 and bag 10 arrangement illustrated in FIG. 8 is useful in providing enhanced imaging for body parts which are somewhat cylindrical in shape, such as a leg or arm. Bags 10 having hollow portions with other shapes are contemplated, however, for use in imaging other parts of the body. Such bags 10 are easily formed from the same materials as the bags 10 described above into a variety of shapes, and then sealed to the inside walls of the outer shell 40. Of course, filler material as previously described may also be positioned in the bag 10 itself.

Figure 9:
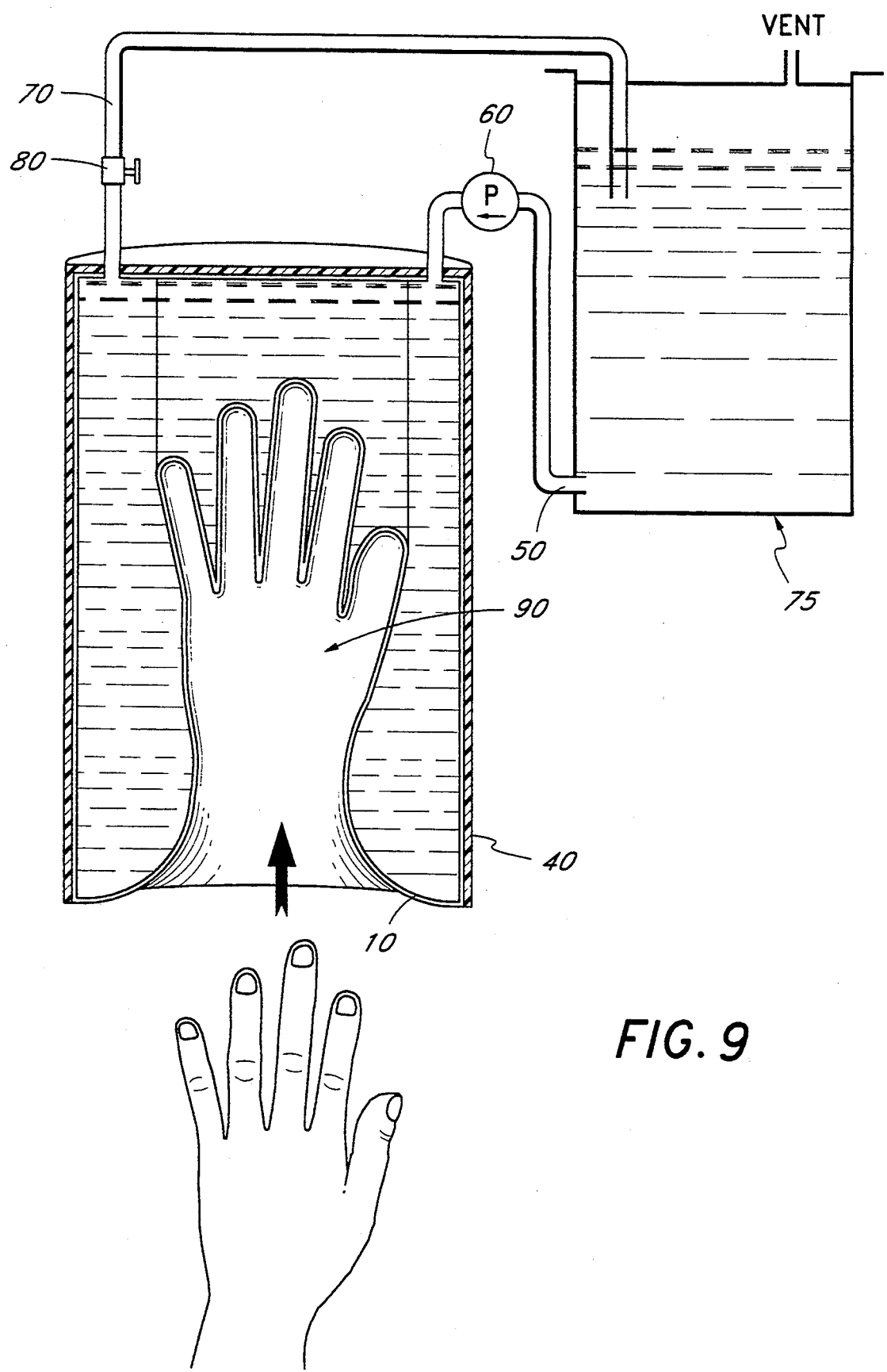
FIG. 9 is a cross sectional view of a bag having a glove shaped hollow portion, the bag containing fat saturation enhancing material and positioned within an outer shell, the bag also having a reservoir and pump system for filling and draining said bag.

In order to facilitate maximum contact between the bag 10 and a body part positioned therein, it is desired that the bag 10 be selectively fillable. As illustrated in FIGS. 8 & 9, the bag 10 is connected to an inlet pipe or tube 50 which has a pump 60 mounted sequentially therein, and an outlet pipe or tube 70 having a shut-off valve 80 mounted therein. A reservoir 75 is provided which is connected to the opposite ends of the inlet 50 and outlet 70 tubes. The bag 10 is filled by turning on the pump 60 to feed the fat saturation enhancing material through the inlet tube 50 from the reservoir 75, while at the same time closing the valve 80 to prevent draining of the material back out of the bag. In this fashion, the bag 10 may be selectively filled so as to provide the maximum contact between the bag surface and the body of a patient. The bag 10 may also be selectively drained by opening valve 80 when the pump 60 is turned off, in order to allow the body part of a patient to be easily removed and the bag 10 readied for another patient. It is possible to make the bag 10 selectively fillable in any of a number of other means well known in the art, including merely connecting a reservoir to the bag and then raising or lowering the reservoir to allow gravity flow of the fat saturation enhancing material to and from the bag 10.

Figure 10:
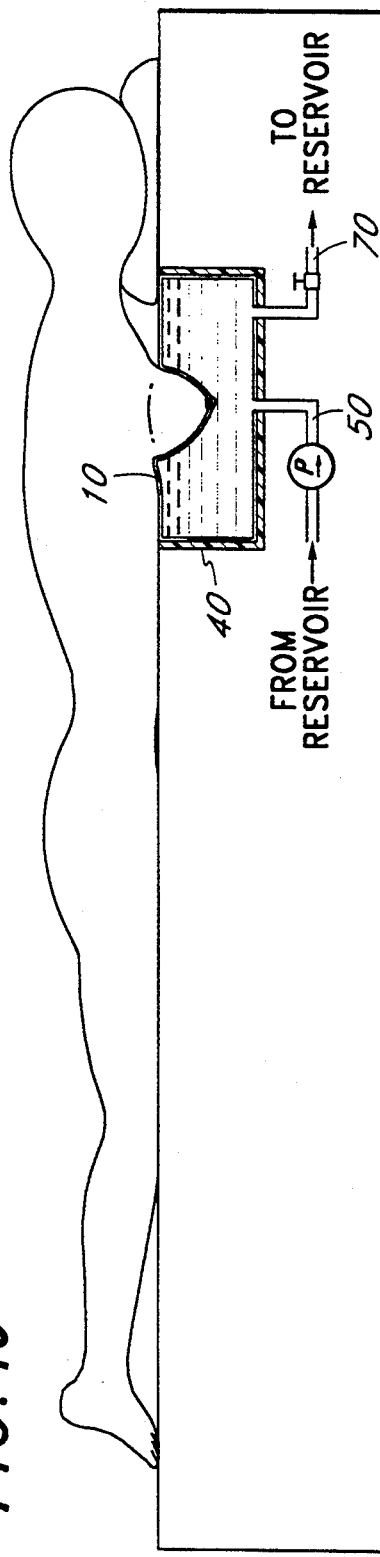
FIG. 10 is a cross sectional view of a bag mounted within a shell and used in conjunction with breast imaging.
Figure 12:
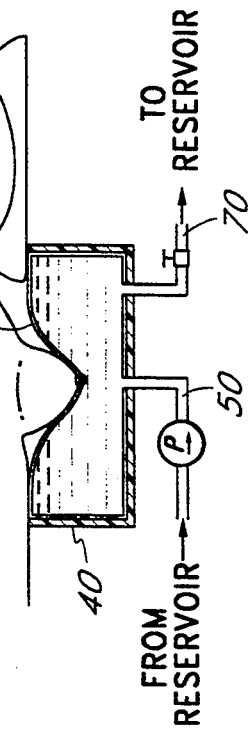
FIG. 12 is a cross sectional view of the bag and shell configuration of FIG. 10 as the bag is filled so as to conform to a patient's breast.
Figure 11:
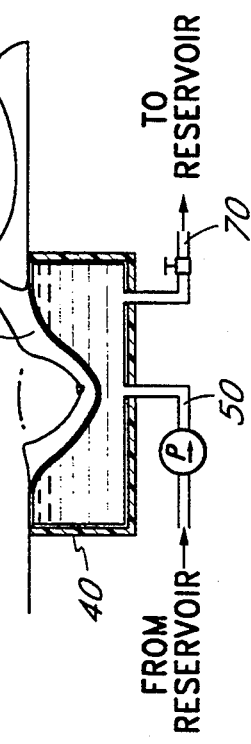
FIG. 11 is a cross sectional view of the bag and shell configuration of FIG. 10 before the bag is completely filled.

As illustrated in FIGS. 10–12, the selectively fillable bag 10 is particularly useful when used in conjunction with MR imaging of angular body parts such as the breast or ankle. As illustrated, the bag 10 fits within a shell 40 which is inset into the MR table. The bag 10 itself is contained within the shell 40 on all of its sides except the side facing upward towards the patient. The hollowed portion of the bag 10 when used for this purpose is preferably a slight depression formed into the bag 10 on the side which faces the patient. This depression facilitates the introduction of a patient's breast.

The bag 10 is again selectively fillable, as described above in conjunction with FIGS. 8 & 9, in order that the bag 10 and fat saturation enhancing material therein may be placed into contact with the patient's breasts and surrounding tissue. As illustrated in FIG. 11, before imaging, the bag 10 may be at least partially emptied of the fat saturation material. The patient is positioned face down with a breast located in the depressed area of the bag 10. The bag 10 is then filled with the fat saturation enhancing material as illustrated in FIG. 12, until the bag 10 conforms to the breast and surrounding tissue, as illustrated in FIG. 10.

The bag 10 and shell 40 arrangement described above is useful in improving fat saturation when imaging a single breast and surrounding tissue. It is, of course, possible to have two such bag 10 and shell 40 arrangements, one for each breast, so that both may be imaged simultaneously. Alternatively, it is possible to image both breasts by having a larger bag 10 and shell 40 system in which the bag 10 has two depressed areas, and where the volume of fat saturation enhancing material is increased. The bag 10 and shell 40 arrangement may similarly be used to image other body parts.

Figure 13:
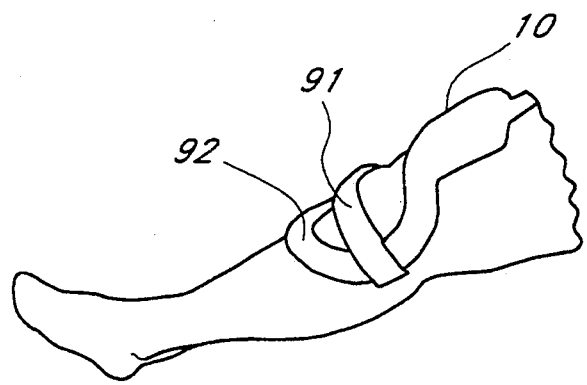
FIG. 13 is a flexible MR coil inside of a bag containing fat saturation enhancing material wrapped around a patient's knee.

As illustrated in FIG. 13, a flexible coil 90 inserted in a bag 10 containing fat saturation enhancing material is particularly useful for imaging an irregularly shaped body part such as a knee. The flexible coil can be shaped to fit around the body part allowing for wrap-around imaging. Positioning the coil inside of a flexible bag 10 containing fat saturation enhancing material allows the entire unit to conform to the body shape while improving fat saturation and eliminating air space between the MR coil and the body part. The entire unit can be held in place using a strap 91 or other attachment means in order to secure it to the patient. Such attachment means may include Velcro ® brand hook and loop fastener, adhesive tape, or other means known in the art which do not interfere with the image during the MR examination. A disposable sheath around the flexible coil can be used to protect it from direct contact with the fat saturation enhancing material inside the bag. The sheath could be made of flexible material such as described in FIG. 2.

As can be understood with reference to FIG. 8, a flexible coil and bag unit could also be made in which the MR coil forms one side to the unit and the attached flexible pouch filled with fat saturation material forms the other side of the unit. Preferably, the upper portion of the unit, distal to the patient would be the flexible MR coil and the lower portion, proximal to the patient, would be the fat saturation material filled bag. Such a unit would be flexible and allow for maximum contact between the patient, the fat saturation material, and the MR imaging coil, especially for body parts that have an odd geometry as described above.

Figure 14:
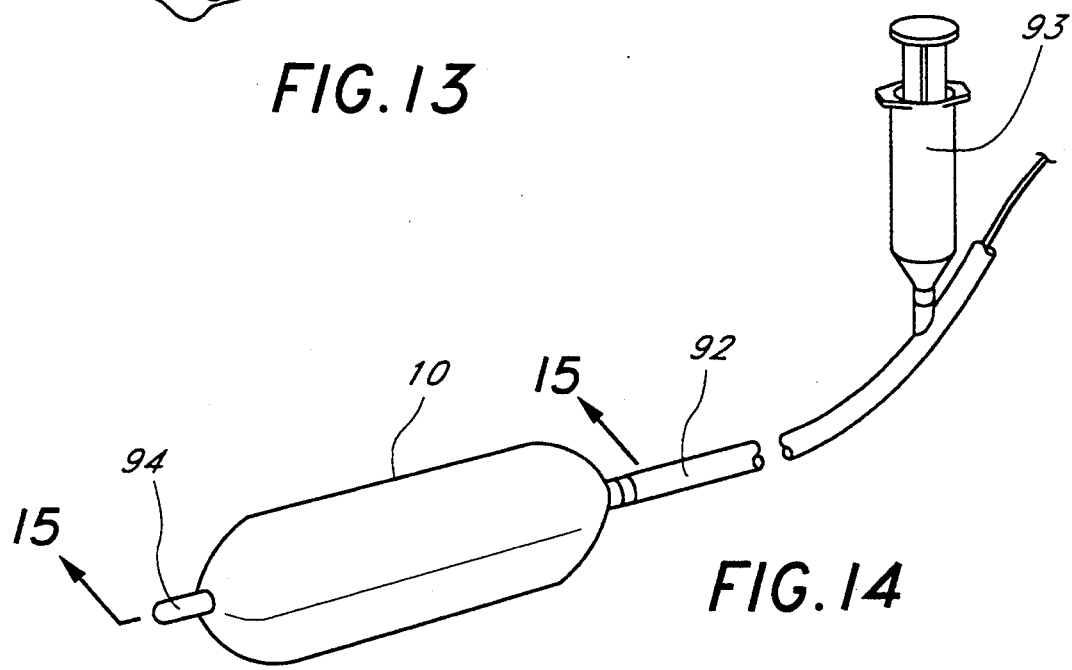
FIG. 14 is an endo-cavity coil where the MR coil is enclosed in a bag into which fat saturation enhancing material may be introduced.
Figure 15:
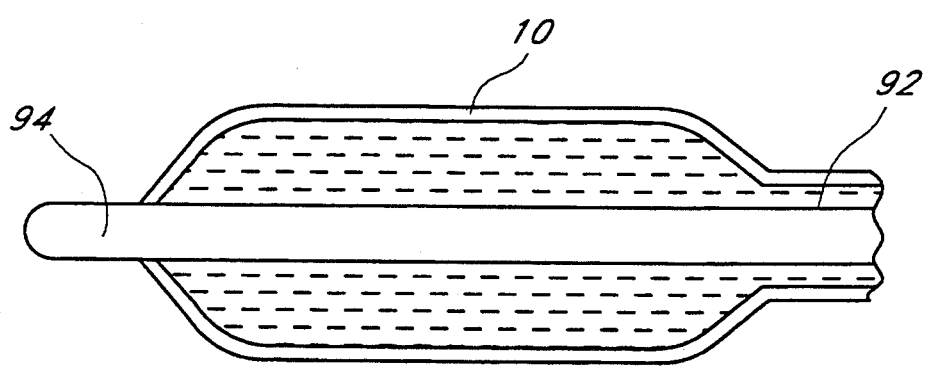
FIG. 15 is a cross-sectional view of the endo-cavity coil of FIG. 14 after the bag has been filled.

As illustrated in FIG. 14, an endo-cavity coil where the MR coil 94 is enclosed in a bag 10 into which fat saturation enhancing material is introduced can be used to image inside body cavities. The bag 10 is attached to a means for introducing and removing fat saturation material. In FIG. 14, this is illustrated as a tube 92 for filling the bag with fat saturation enhancing material from a hypodermic syringe 93. This illustration is schematic; thus, any suitable source of fat saturation material and introducing and removing means associated therewith can be used. The unfilled coil and bag unit can be placed inside the body cavity to be imaged, such as the mouth, vagina, rectum or gastrointestinal tract. Fat saturation material can then be introduced into the bag 10 from the syringe 93 or other source via the tube 92. Thus the bag is filled with fat saturation enhancing material as illustrated in FIG. 15 to the comfort of the patient. Upon filling, the bag conforms to the shape of the inside of the body cavity to enhance imaging of the cavity.

Although this invention has been described in terms of certain preferred embodiments, other embodiments that are apparent to those of ordinary skill in the art are also within the scope of this invention. Accordingly, the scope of the invention is intended to be defined only by reference to the following claims.

What is claimed is:

1. A method of improving fat saturation during magnetic resonance imaging, comprising:

placing nonaqueous solid or liquid fat saturation enhancing material in a container that is placed against a portion of tissue to be imaged with a magnetic resonance imaging system;

imaging said tissue with a magnetic resonance imaging system.

2. The method of claim 1, wherein said fat saturation enhancing material includes, at least in part, a material enclosed in a container.

3. The method of claim 2, wherein said container is flexible.

4. The method of claim 3, wherein said container is formed from thin sheets.

5. The method of claim 4, wherein said sheets are made from a material selected from the group consisting of ethylvinylacetate, polyurethane, nylon, polyethylene, and polyester.

6. The method of claim 2, wherein said container is a bag.

7. The method of claim 6, wherein said bag has a hollow portion and is mounted within an outer shell.

8. The method of claim 2, wherein said container is selectively fillable.

9. The method of claim 2, wherein said container also contains a space-filling material in the fat saturation enhancing material.

10. The method of claim 9, wherein said space filling material is selected from the group consisting of: silica, diatomaceous earth, polyurethane foam, rubber foams, polyester, absorbent cloth, and absorbent paper.

11. The method of claim 1, wherein the fat saturation enhancing material comprises a fluorocarbon.

12. The method of claim 2, wherein the fat saturation enhancing material is a fluorocarbon material selected from the group consisting of perfluorooctylbromide, perfluorodecylbromide, FC-77 and FC-43.

13. The method of claim 1, wherein the fat saturation enhancing material comprises a non-protonated or minimally protonated material.

14. The method of claim 1, wherein the fat saturation enhancing material comprises a compound in which the protons of the said material do not resonate at the same frequency as protons imaged by said magnetic resonance imaging system.

15. The method of claim 2, wherein said container surrounds a flexible magnetic resonance imaging coil.

16. The method of claim 2, additionally comprising the step of stacking a plurality of containers around a part of the body of a patient to be imaged.

17. The method of claim 16, wherein said plurality of containers are joined to each other in order to secure said containers at or around said part of the body.

18. The method of claim 2, wherein said placing step comprises placing said container so that said container concentrically surrounds said part of the body.

19. A device for enhancing the fat saturation ability of a magnetic resonance imaging system, comprising:

a container adapted to be placed in contact with a body part to be imaged with MRI, to minimize the body-air interface; and a fat saturation enhancing material in said container.

20. The device of claim 19, wherein said container is flexible.

21. The device of claim 20, wherein said container is formed from thin sheets.

22. The device of claim 21, wherein said sheets are made from a material selected from the group consisting of ethylvinylacetate, polyurethane, nylon, polyethylene, and polyester.

23. The device of claim 19, wherein said container is a bag.

24. The device of claim 23, wherein said container further encloses a MR imaging coil.

25. The device of claim 24, wherein said imaging coil and said container are flexible.

26. The device of claim 23, wherein said bag has a hollow portion and is mounted within an outer shell that is more rigid than the bag.

27. The device of claim 19, wherein said container is selectively fillable.

28. The device of claim 19, wherein said container has fastening means for securing one container to another when such containers are placed at or around a part of the body to be imaged.

29. The device of claim 19, wherein said container also contains a space-filling solid material.

30. The device of claim 29, wherein said space-filling material is selected from the group consisting of: silica, diatomaceous earth, polyurethane foam, rubber foams, polyester, absorbent cloth, and absorbent paper.

31. The device of claim 19, wherein the fat saturation enhancing material comprises a fluorocarbon.

32. The device of claim 31, wherein the fluorocarbon material is selected from the group consisting of perfluorooctylbromide, perfluorodecylbromide, FC-77 and FC-43.

33. The device of claim 19, wherein the fat saturation enhancing material comprises a non-protonated or minimally protonated material.

34. The device of claim 19, wherein the fat saturation enhancing material comprises a compound in which the protons of said material do not resonate at the same frequency as protons imaged by said MRI device.

* * * * *